US009911677B2

(12) United States Patent
Mizuno et al.

(10) Patent No.: US 9,911,677 B2
(45) Date of Patent: Mar. 6, 2018

(54) ELEMENT CHIP AND METHOD FOR MANUFACTURING THE SAME

(71) Applicant: Panasonic Intellectual Property Management Co., Ltd., Osaka (JP)

(72) Inventors: Bunzi Mizuno, Nara (JP); Mitsuru Hiroshima, Osaka (JP); Shogo Okita, Hyogo (JP); Noriyuki Matsubara, Osaka (JP); Atsushi Harikai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/427,548

(22) Filed: Feb. 8, 2017

(65) Prior Publication Data

US 2017/0263526 A1    Sep. 14, 2017

(30) Foreign Application Priority Data

Mar. 11, 2016  (JP) ................. 2016-048006

(51) Int. Cl.
| | |
|---|---|
| H01L 23/31 | (2006.01) |
| H01L 21/311 | (2006.01) |
| H01L 21/428 | (2006.01) |
| H01L 21/56 | (2006.01) |
| H01L 21/78 | (2006.01) |
| H01L 23/544 | (2006.01) |

(52) U.S. Cl.
CPC .... *H01L 23/3192* (2013.01); *H01L 21/31116* (2013.01); *H01L 21/428* (2013.01); *H01L 21/561* (2013.01); *H01L 21/78* (2013.01); *H01L 23/544* (2013.01); *H01L 2223/5446* (2013.01)

(58) Field of Classification Search
CPC ............ H01L 21/31116; H01L 21/428; H01L 21/561; H01L 21/78; H01L 23/3192; H01L 23/544; H01L 2223/5446
See application file for complete search history.

(56) References Cited

U.S. PATENT DOCUMENTS 9,299,576 B2 * 3/2016 Oda .................. H01L 21/30655
9,299,579 B2 * 3/2016 Tomura ............ H01L 21/76897
(Continued)

FOREIGN PATENT DOCUMENTS

JP      2013-535114 A    9/2013

*Primary Examiner* — Allan R Wilson
(74) *Attorney, Agent, or Firm* — Pearne & Gordon LLP

(57) ABSTRACT

A method for manufacturing an element chip includes a protection film etching step of removing a part of the protection film which is stacked on the dividing region and the protection film which is stacked on the element region through etching the protection film anisotropically by exposing the substrate to first plasma and remaining the protection film for covering an end surface of the element region. Furthermore, the method for manufacturing an element chip includes an isotropic etching step of etching the dividing region isotropically by exposing the substrate to second plasma and a plasma dicing step of dividing the substrate to a plurality of element chips including the element region by exposing the substrate to third plasma in a state where the second main surface is supported by a supporting member.

5 Claims, 9 Drawing Sheets

(56) References Cited

U.S. PATENT DOCUMENTS

| | | | |
|---|---|---|---|
| 2011/0003433 A1* | 1/2011 | Harayama | H01L 21/561 438/113 |
| 2011/0312157 A1 | 12/2011 | Lei et al. | |
| 2012/0289023 A1* | 11/2012 | Ahrens | H01L 21/76232 438/430 |
| 2014/0191352 A1* | 7/2014 | Wang | H01L 27/14618 257/433 |
| 2016/0005651 A1* | 1/2016 | Watanabe | H01L 21/31116 438/702 |
| 2016/0218067 A1* | 7/2016 | Masuko | H01L 23/562 |

* cited by examiner

ELEMENT CHIP AND METHOD FOR MANUFACTURING THE SAME

BACKGROUND

1. Technical Field

The present disclosure relates to an element chip and a method for manufacturing the same and, in particular, a method for manufacturing an element chip excellent in flexural strength.

2. Description of the Related Art

An element chip is manufactured by dicing substrate 30 including first layer 31 that is a semiconductor layer and second layer 32 including an insulating film as illustrated in FIGS. 7A to 7C. Substrate 30 includes dividing region R11 for dividing substrate 30 and a plurality of element regions R12 to be defined by dividing region R11 (FIG. 7A). By removing dividing region R11 of substrate 30, substrate 30 is diced and a plurality of element chips 130 are formed. PTL 1 discloses that substrate 30 is diced through etching with plasma P (FIG. 7C) after scribing dividing region R11 with laser light L (FIG. 7B).

CITATION LIST

Patent Literature

PTL 1: Japanese Patent Unexamined Publication (Translation of PCT Application) No. 2013-535114

SUMMARY

However, first layer 31 is exposed to the end surface of element chip 130 to be obtained in this method. Since first layer 31 that is a semiconductor layer has high crystallinity, first layer 31 tends to be a starting point of cleavage. Therefore, deflective strength of element chip 130 is easily reduced.

An aspect of the present disclosure relates to a method for manufacturing an element chip including a step of preparing a substrate, a laser scribing step, a protection film stacking step after the laser scribing step, a protection film etching step after the protection film stacking step, a isotropic etching step after the protection film etching step, and a plasma dicing step after the isotropic etching step. In the step of preparing a substrate, substrate which has a first main surface and a second main surface and includes a first layer that is a semiconductor layer, a second layer including an insulating film formed on a side of the first main surface of the first layer, a plurality of element regions, and a dividing region for defining the element region, is prepared. In the laser scribing step, an opening including an exposing portion for exposing the first layer at the dividing region by irradiating the dividing region with laser light from the side of the first main surface, is formed. In the protection film stacking step, a protection film is stacked on the element region and the dividing region. In the protection film etching step, a part of the protection film which is stacked on the dividing region and the protection film which is stacked on the element region are removed through etching the protection film anisotropically by exposing the substrate to first plasma and the protection film for covering an end surface of the element region is remained. In the isotropic etching step, the dividing region is etched isotropically by exposing the substrate to second plasma. In the plasma dicing step, the substrate is divided to a plurality of element chips including the element region through etching the dividing region anisotropically by exposing the substrate to third plasma in a state where the second main surface is supported by a supporting member.

Another aspect of the disclosure relates to an element chip including a first layer that is a semiconductor layer including a lamination surface and a surface located at a side facing the lamination surface, a second layer including an insulating film which is laminated on the lamination surface, and a protection film that surrounds an outer periphery of the second layer on an end surface of the second layer and is protruded from the end surface of the first layer.

According to the present disclosure, since the damage in the semiconductor layer which is to be a starting point of cleavage is suppressed by the protection film, flexural strength of an element chip can be improved. Furthermore, the damage such as cracks or clips of the element chip hardly occurs.

DETAILED DESCRIPTIONS

In the present exemplary embodiments, an element chip is manufactured such that the semiconductor layer of a diced element chip is not easily damaged. That is, as described above, the element chip is manufactured by a step of preparing a substrate, a laser scribing step, a protection film stacking step after the laser scribing step, a protection film etching step after the protection film stacking step, an isotropic etching step after the protection film etching step, and a plasma dicing step after the isotropic etching step.

The step of preparing a substrate is a step of preparing a substrate which has a first main surface and a second main surface and includes a first layer that is a semiconductor layer, a second layer including an insulating film formed on a side of the first main surface of the first layer, a plurality of element regions, and a dividing region for defining each of the element region.

The laser scribing step is a step of forming an opening including an exposing portion for exposing the first layer at the dividing region by irradiating the dividing region with laser light from the side of the first main surface.

The protection film stacking step is a step of stacking a protection film on the element region and the dividing region.

The protection film etching step is a step of removing a part of the protection film which is stacked on the dividing region and the protection film which is stacked on the element region through etching the protection film anisotropically by exposing the substrate to first plasma and remaining the protection film for covering an end surface of each of the element regions.

The isotropic etching step is a step of etching the dividing region isotropically by exposing the substrate to second plasma, after the protection film etching step.

The plasma dicing step is a step of dividing the substrate to a plurality of element chips including the element regions through etching the dividing region anisotropically by exposing the substrate to third plasma in a state where the second main surface is supported by a supporting member.

First Exemplary Embodiment

Figure 1A:
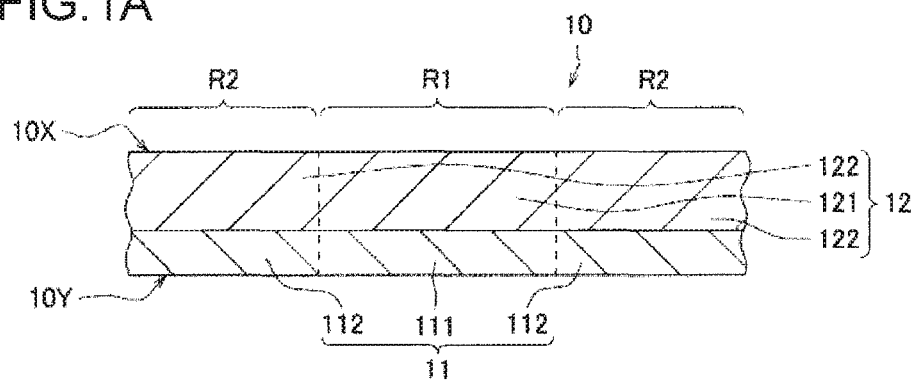
FIG. 1A is a cross-sectional view illustrating a process of a part of a manufacturing method according to an first exemplary embodiment of the present disclosure.

A first exemplary embodiment according to the present disclosure will be described with reference to FIGS. 1A to 1F. FIGS. 1A to 1F are cross-sectional views illustrating each step of the manufacturing method according to the present exemplary embodiment.
(1) Preparing Step Firstly, substrate 10 to be diced is prepared (FIG. 1A). Substrate 10 has first main surface 10X and second main surface 10Y and includes first layer 11 that is a semiconductor layer and second layer 12 including an insulating film which is formed on first main surface 10X side of first layer 11. In addition, substrate 10 is separated into dividing region R1 and the plurality of element regions R2 which are defined by dividing region R1. Accordingly, first layer 11 includes first dividing region 111 corresponding to dividing region R1 and a plurality of first element regions 112 corresponding to element regions R2. Second layer 12 includes a second dividing region 121 corresponding to dividing region R1 and a plurality of second element regions 122 corresponding to element regions R2. A semiconductor circuit, an electric component element and a circuit layer such as MEMS (which are not illustrated) may be formed on element regions R2 of substrate 10 (first element region 112 and second element region 122).

Figure 1B:
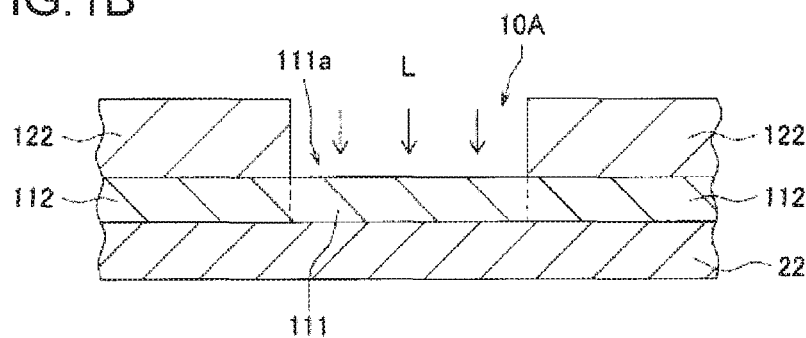
FIG. 1B is a cross-sectional view illustrating a step of a part of the manufacturing method.

First layer 11 is a semiconductor layer formed of, for example, silicon (Si), gallium arsenide (GaAs), gallium nitride (GaN), silicon carbide (SiC), or the like. Second layer 12 includes at least an insulating film. For example, the insulating film includes silicon dioxide ($SiO_2$), silicon nitride ($Si_3N_4$), lithium tantalate ($LiTaO_3$), lithium niobate ($LiNbO_3$), or the like. Second layer 12 may include a multilayer wiring layer (for example, a laminate of a low-k (low dielectric constant) and a copper (Cu) wiring layer), a metal material, a resin protective layer (for example, polyimide), a resist, or the like addition to the insulating film.
(2) Laser Scribing Step In the laser scribing step, a part of second dividing region 121 is removed by irradiating second dividing region 121 with laser light L from first main surface 10x side to form opening 10A in which a part of first dividing region 111 is exposed (FIG. 1B). In other words, in the laser scribing step, exposing portion 111a is formed by exposing a part of first dividing region 111. A center wavelength of laser light L is not particularly limited, and is within a range of 350 to 600 nm inclusive, for example.

Figure 5A:
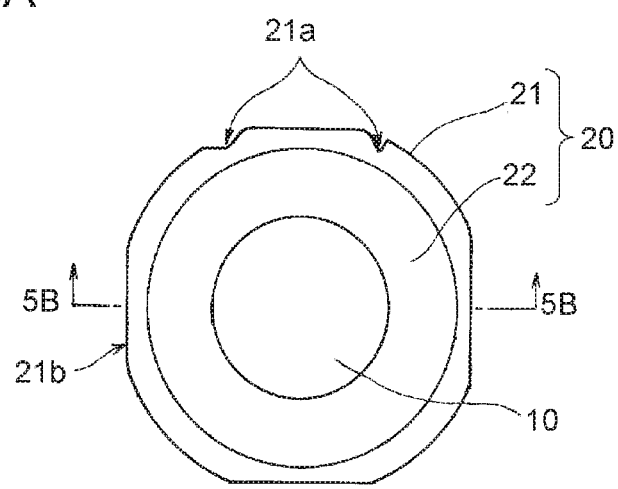
FIG. 5A is a top surface view illustrating a transfer carrier according to the first exemplary embodiment of the present disclosure.
Figure 5B:
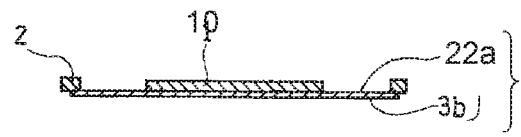
FIG. 5B is a cross-sectional view of the transfer carrier taken along line 5B-5B of FIG. 5A.

From the viewpoint of handling property, the step after the laser scribing step is preferably performed in a state where second main surface 10Y is supported by supporting member 22. The material of supporting member 22 is not particularly limited. Among the materials, when considering that substrate 10 is diced in a state where substrate 10 is supported by supporting member 22, from the viewpoint that element chip 110 to be obtained is easily picked up, supporting member 22 is preferably a flexible resin film. In this case, from the viewpoint of handling property, supporting member 22 is fixed to frame 21. Hereinafter, frame 21 and supporting member 22 which is fixed to frame 21 are collectively referred to as transfer carrier 20. FIG. 5A is a top surface view illustrating transfer carrier 20 and FIG. 5B is a cross-sectional view taken along line 5B-5B of FIG. 5A illustrating transfer carrier 20.

The material of the resin film is not particularly limited, and examples thereof include a thermoplastic resin such as polyolefins such as polyethylene and polypropylene and polyester such as polyethylene terephthalate. Various additives such as a rubber component (for example, ethylene-propylene rubber (EPM), ethylene-propylene-diene rubber (EPDM), or the like) for applying stretchability, a plasticizer, a softener, an antioxidant, a conductive material, and the like may be blended to the resin film. In addition, the thermoplastic resin may have a functional group that exhibits a photopolymerization reaction such as an acrylic group.

For example, supporting member 22 includes a surface having an adhesive (adhesive surface 22a) and a surface having no adhesive (non-adhesive surface 22b). The outer peripheral edge of adhesive surface 22a is adhered to one surface of frame 21 and covers the opening of frame 21. The substrate 10 is adhered and supported on a portion which is exposed from the opening of frame 21 of adhesive surface 22a. When the plasma process is performed, supporting member 22 is mounted on the stage such that the stage (hereinafter, simply referred to as a stage) to be disposed within the plasma processing stage is in contact with non-adhesive surface 22b.

Adhesive surface 22a is preferably formed of the adhesive component in which the adhesive force is reduced by irradiation with an ultraviolet lay (UV). Accordingly, when element chip 110 is picked up after the plasma dicing, element chip 110 is easily peeled off from adhesive surface 22a by performing UV irradiation, element chip 110 is easily picked up. For example, supporting member 22 is obtained by applying a UV curable acrylic adhesive on one surface of a resin film in a thickness of 5 to 20 μm.

Frame 21 is a frame body having an opening with an area equal to or larger than the entire area of semiconductor substrate 10 and has a predetermined width and a substantially constant thin thickness. Frame 21 has the rigidity to extent that supporting member 22 and semiconductor substrate 10 can be transported in a state where supporting member 22 and semiconductor substrate 10 are held. The shape of the opening of frame 21 is not particularly limited. However, the shape thereof may be a polygon such as a circle, a rectangle, a hexagon, or the like. Notch 21a or corner cut 21b for positioning may be provided in frame 21. Examples of the material of frame 21 include metals such as aluminum and stainless steel, a resin, or the like.

(3) Protection Film Stacking Step

Figure 1C:
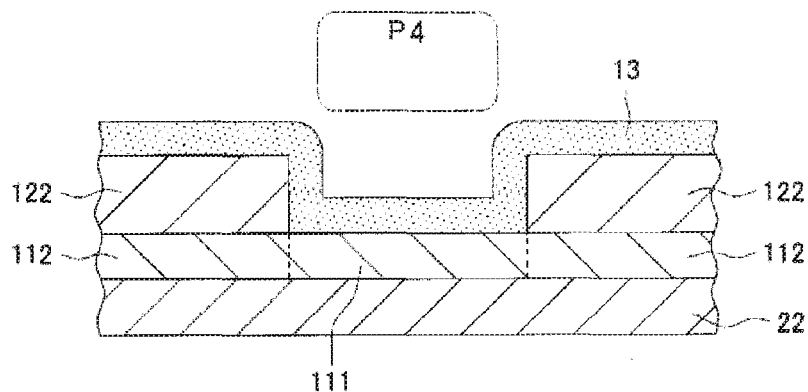
FIG. 1C is a cross-sectional view illustrating a step of a part of the manufacturing method.

After the laser scribing step, protection film 13 is stacked on the front surface of second element region 122 and end surfaces of exposing portion 111a and second element region 122 (FIG. 1C). The stacking of protection film 13 can be performed by exposing substrate 10 to fourth plasma P4, for example. This method is called a plasma CVD, and is excellent in a point that a thin film can be formed at a relatively low temperature and at a high speed.

Protection film 13 to be stacked may have insulation properties and the composition thereof is not particularly limited. Protection film 13 may contain inorganic material such as silicon oxide, silicon nitride, or silicon oxynitride, may contain an organic material such as a polymer, or a composite material of the inorganic material and the organic material. Among these materials, when considering a feature that a part of protection film 13 becomes an element for configuring element chip 110 after dicing (refer to FIGS. 2A and 2B), it is preferable that a part of protection film 13 is a material having high water repellency and low hygroscopicity. An example of the material includes fluorocarbon.

In order to stack protection film 13 containing fluorocarbon, plasma which uses a process gas containing fluorocarbon such as $CF_4$, or $C_4F_8$ may be used. The thickness of stacking protection film 13 is not particularly limited, and is within a range of 0.5 to 10 μm inclusive, for example.

Protection film 13 can be stacked under the conditions that the pressure in the process chamber is adjusted to 15 to 25 Pa, power to be inputted from first high frequency power supply 210A to antenna 209 is set to 1500 to 2500 W and power to be inputted from second high frequency power surface 210B to high frequency electrode portion 220 is set to 50 to 150 W, while supplying 150 sccm of $C_4F_8$ and 50 sccm of helium (He) as a raw material, for example. When a process is performed for 300 seconds under the conditions, protection film 13 having a thickness of 3 μm can be formed. In the present exemplary embodiment, as the raw material gas, a mixed gas of $C_4F_8$ and He is used. By using He, dissociation of $C_4F_8$ is accelerated in the plasma. As a result, dense protection film 13 with a high adhesion is formed. The sccm is a unit of a flow rate and 1 sccm is an amount of the gas in standard state (0° C., 1 atmosphere) flowing 1 $cm^3$ per a minute.

Figure 6:
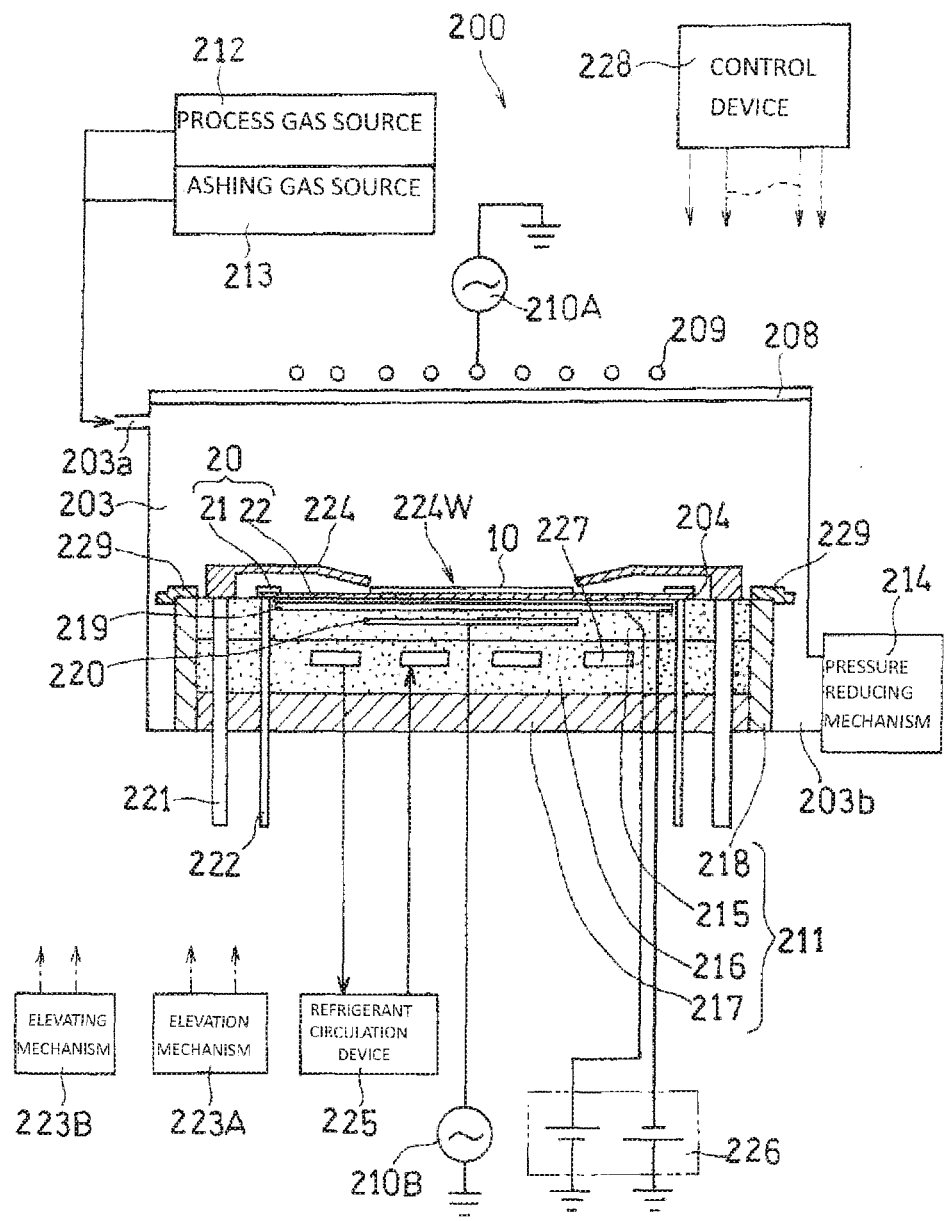
FIG. 6 is a conceptual diagram illustrating a schematic structure of a plasma processing device according to the first exemplary embodiment of the present disclosure.
Figure 7A:
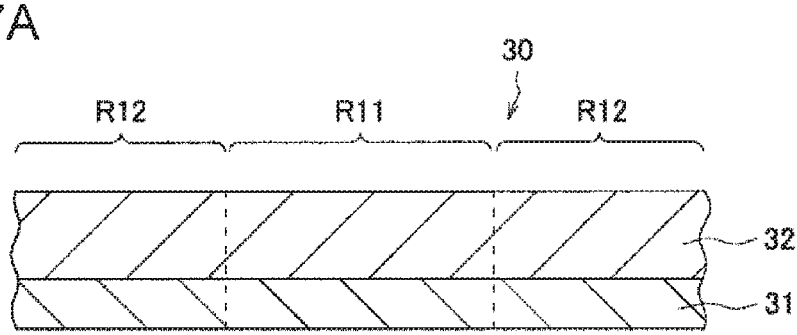
FIG. 7A is a cross-sectional view illustrating a step of a manufacturing method of an element chip in the related art.
Figure 7B:
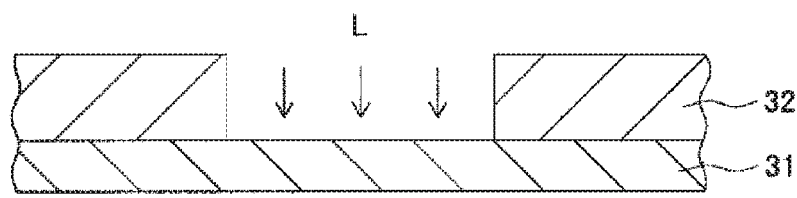
FIG. 7B is a cross-sectional view illustrating a step of the manufacturing method of the element chip.
Figure 7C:
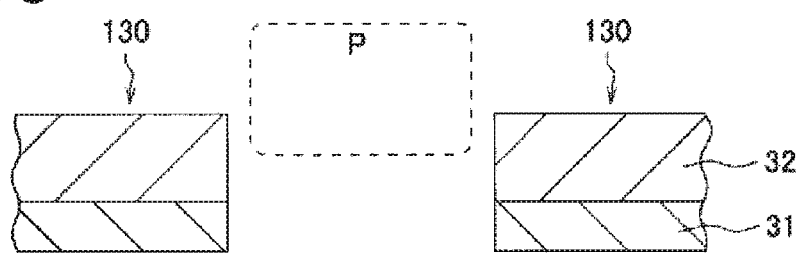
FIG. 7C is a cross-sectional view illustrating a step of the manufacturing method of the element chip.

Plasma processing device 200 to be used in the plasma the plasma etching, and the plasma dicing will be described in detail with reference to FIG. 6. However, the plasma processing device is not limited thereto. FIG. 6 schematically illustrates a structure of plasma processing device 200 to be used in the present exemplary embodiment, in a cross-section.

Plasma processing device 200 includes stage 211. Transfer carrier 20 is mounted on stage 211 such that the surface, on which semiconductor substrate 10 of supporting member 22 is held, faces upward. Cover 224 having window portion 224W for covering at least a part of frame 21 and supporting member 22 and for exposing at least a part of substrate 10 is disposed above stage 211.

Stage 211 and cover 224 are disposed inside a process chamber (vacuum char 203). Vacuum chamber 203 has a roughly cylindrical shape with an upper portion opened and the upper opening is closed by dielectric member 208 that is a lid. As a material configuring vacuum chamber 203, aluminum, stainless steel (SUS), aluminum in which the surface is alumite-processed, and the like can be exemplified. As the material configuring dielectric member 208, a dielectric material such as yttrium oxide ($Y_2O_3$), aluminum nitride (AlN), alumina ($Al_2O_3$), quartz ($SiO_2$), and the like can be exemplified. Antenna 209 as an upper electrode is disposed above dielectric member 208. Antenna 209 is electrically connected to first high frequency power supply 210A. Stage 211 is disposed at the bottom portion side inside vacuum chamber 203.

Gas feed port 203a is connected to vacuum chamber 203. Process gas source 212 and ashing gas source 213 that are a supply source of the process gas is connected to gas feed port 203a respectively, by pipes. In addition, exhaust port 203b is provided on vacuum chamber 203, and pressure reducing mechanism 214 including a vacuum pump for evacuating the gas in vacuum chamber 203 and decompressing the gas is connected to exhaust port 203b.

Stage 211 includes electrode layer 215, metal layer 216, base 217 for supporting, electrode layer 215 and metal layer 216, and outer peripheral portion 218 surrounding electrode layer 215, metal layer 216, and base 217 which have substantially circular shape. Outer peripheral portion 218 is configured of the metal layer with conductivity and etching resistance, and protects electrode layer 215, metal layer 216, and base 217 from the plasma. Annular outer peripheral ring 229 is disposed on the upper surface of outer peripheral portion 218. Outer peripheral ring 229 serves to protect the upper surface of outer peripheral portion 218 from the plasma. Electrode layer 215 and outer peripheral ring 229 are configured of, for example, the above-described dielectric material.

An electrode portion (hereinafter, referred to as an ESC electrode 219) for configuring electrostatic suction mechanism and high frequency electrode portion 220 which is electrically connected to second high frequency power surface 210B are disposed inside electrode layer 215. Direct-current power supply 226 is electrically connected to ESC electrode 219. The electrostatic suction mechanism is configured of ESC electrode 219 and direct-current power supply 226.

Metal layer 216 is configured of, for example, aluminum in which an alumite coating is formed on the surface thereof. Coolant flow path 227 is formed in metal layer 216. Coolant flow path 227 cools stage 211. By cooling stage 211, supporting member 22 mounted on stage 211 is cooled and cover 224 in which a part, thereof is in contact with stage 211 is also cooled. Accordingly, substrate 10 or supporting member 22 is suppressed from being damaged by being heated during plasma processing. The coolant in coolant flow path 227 is circulated by refrigerant circulation device 225.

A plurality of supporting portions 222 passing through stage 211 is disposed in the vicinity of stage 211. Supporting portion 222 is driven to move up and down by elevation mechanism 223A. When transfer carrier 20 is transported into vacuum chamber 203, transfer carrier 20 is transferred to supporting portion 222 which is raised to a predetermined position. Supporting portion 222 supports frame 21 of transfer carrier 20. The upper end surface of supporting member 22 descends to the same level as stage 211. Accordingly, transfer carrier 20 is mounted on a predetermined position of stage 211.

A plurality of elevating rods 221 are connected to the end portion of cover 224, thereby capable of elevating cover 224. Elevating rod 221 is driven to move up and down by elevating mechanism 223B. The elevating operation of cover 224 by elevating mechanism 223B can be performed independently of elevation mechanism 223A.

Control device 228 controls an operation of an element for configuring plasma processing device 200 including first high frequency power supply 210A, second high frequency power surface 210B, process gas source 212, ashing gas source 213, pressure reducing mechanism 214, refrigerant circulation device 225, elevation mechanism 223A, elevating mechanism 223B, and the electrostatic suction mechanism.

As the stacking method of protection film 13, a thermal CVD method, a sputtering method, or the like can be used in addition to the above-described plasma CVD method.

(4) Protection Film Etching Step

Figure 1D:
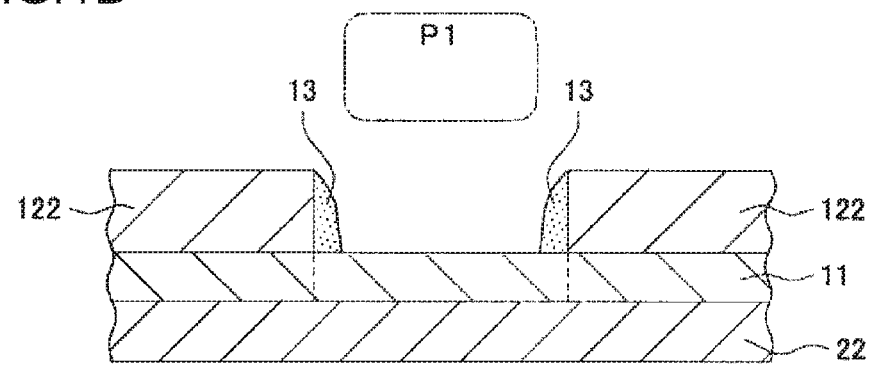
FIG. 1D is a cross-sectional view illustrating a step of a part of the manufacturing method.

After the protection film stacking step, protection film 13 is anisotropically etched by exposing substrate 10 to first plasma P1 (FIG. 1D). By the anisotropic etching, a part of protection film 13 which is stacked on exposing portion 111a and protection film 13 which is stacked on the front surface of second element region 122 are removed. On the other hand, the end surface of second element region 122 is covered with protection film 13.

In this time, from the viewpoint of that the etching is easily progressed anisotropically, while high frequency power is applied to high frequency electrode portion 220 and the bias voltage is applied, it is preferable to perform the etching. The etching is performed under the conditions that the pressure in vacuum chamber 203 is adjusted to 0.2 to 1.5 Pa, power to be inputted from first high frequency power supply 210A to antenna 209 is set to 1500 to 2500 W, and power to be inputted from second high frequency power surface 210B to high frequency electrode portion 220 is set to 150 to 300 W, while supplying 150 to 300 sccm of argon (Ar) and 0 to 150 sccm of oxygen ($O_2$) as a raw material, for example. Under the conditions, protection film 13 can be etched at a range of about 0.5 μm/min.

(5) Isotropic Etching Step

Figure 1E:
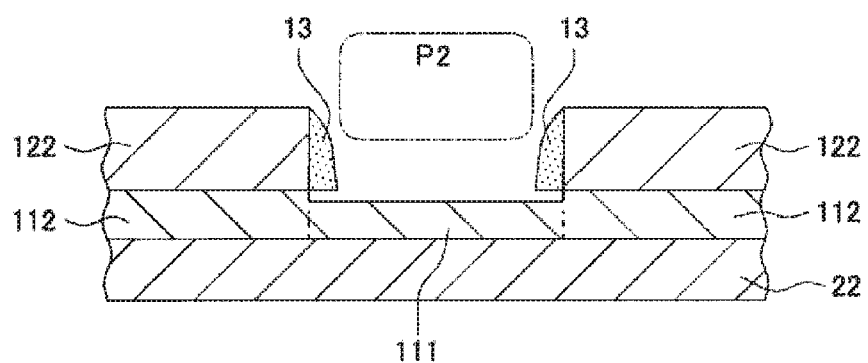
FIG. 1E is a cross-sectional view illustrating a step of a part of the manufacturing method.

After the protection film etching step and before the plasma dicing step, substrate 10 is exposed to second plasma P2 (FIG. 1E). In this time, second element region 122 and protection film 13 serve as a mask. However, by etching under the etching condition for proceeding the etching isotropically, a portion covered with protection film 13 is etched in addition to a portion which is not covered with protection film 13 of first dividing region 111. In FIG. 1E, entire the surface of the portion which is covered with protection film 13 of first dividing region 111 is etched as follows. Although the condition of the isotropic etching step is not particularly limited, from the viewpoint of that first dividing region 111 is etched and the etching is easily progressed isotropically, a process gas containing fluorine such as sulfur hexafluoride ($SF_6$) is preferably used.

(6) Plasma Dicing Step

Figure 1F:
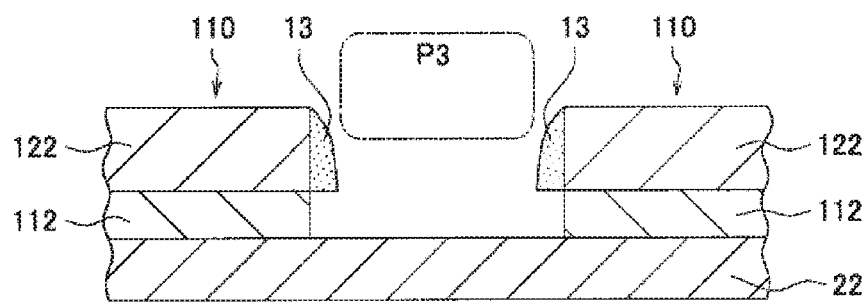
FIG. 1F is a cross-sectional view illustrating a step of a part of the manufacturing method.

Next, substrate 10 is exposed to third plasma P3 (FIG. 1F). Third plasma P3 is generated under the condition in which first dividing region 111 is anisotropically etched. For example, a process gas including such as sulfur hexafluoride ($SF_6$) is used and a bias voltage is applied by applying high frequency power to high frequency electrode portion 220. Accordingly, the etching is anisotropically performed in a direction parallel to the thickness of substrate 10. The above-described etching condition can be appropriately selected depending on the material of first layer 11. In a case where first layer 11 includes Si, a so-called Bosch process can be used for etching first dividing region 111. In the Bosch process, a stacked film stacking step, a stacked film etching step, and a Si etching step are sequentially repeated to dig first dividing region 111 in the depth direction.

For example, the stacked film stacking step is performed under the conditions that the pressure in vacuum chamber 203 is adjusted to 15 to 25 Pa, power to be inputted from first high frequency power supply 210A to antenna 209 is set to 1500 to 2500 W, power to be inputted from second high frequency power surface 210B to high frequency electrode portion 220 is set to 0 W, and the process is performed for 5 to 15 seconds, while supplying 150 to 250 sccm of $C_4F_8$ as a raw material.

For example, the stacked film etching step is performed under the conditions that the pressure in vacuum chamber 203 is adjusted to 5 to 15 Pa, power to be inputted from first high frequency power supply 210A to antenna 209 is set to 1500 to 2500 W, power to be inputted from second high frequency power surface 210B to high frequency electrode portion 220 is set to 100 to 300 W, and the process is performed for 2 to 10 seconds, while supplying 200 to 400 sccm of $SF_6$ as a raw material.

For example, the Si etching step is performed under the conditions that the pressure in vacuum chamber 203 is adjusted to 5 to 15 Pa, power to be inputted from first high frequency power supply 210A to antenna 209 is set to 1500 to 2500 W, power to be inputted from second high frequency power surface 210B to high frequency electrode portion 220 is set to 50 to 200 W, and the process is performed for 10 to 20 seconds, while supplying 200 to 400 sccm of $SF_6$ as a raw material.

Under the above conditions, the stacked film stacking step, the stacked film etching step, and the Si etching step are sequentially repeated to subject etching to first dividing region 111 in the depth direction at a rate of 10 μm/min.

In this case, second element region 122 serves as the mask. Therefore, in the plasma dicing step, first dividing region 111 which is exposed in the isotropic etching step is etched anisotropically. Accordingly, substrate 10 is diced to a plurality of element chips 110 including element regions R2.

Figure 2:
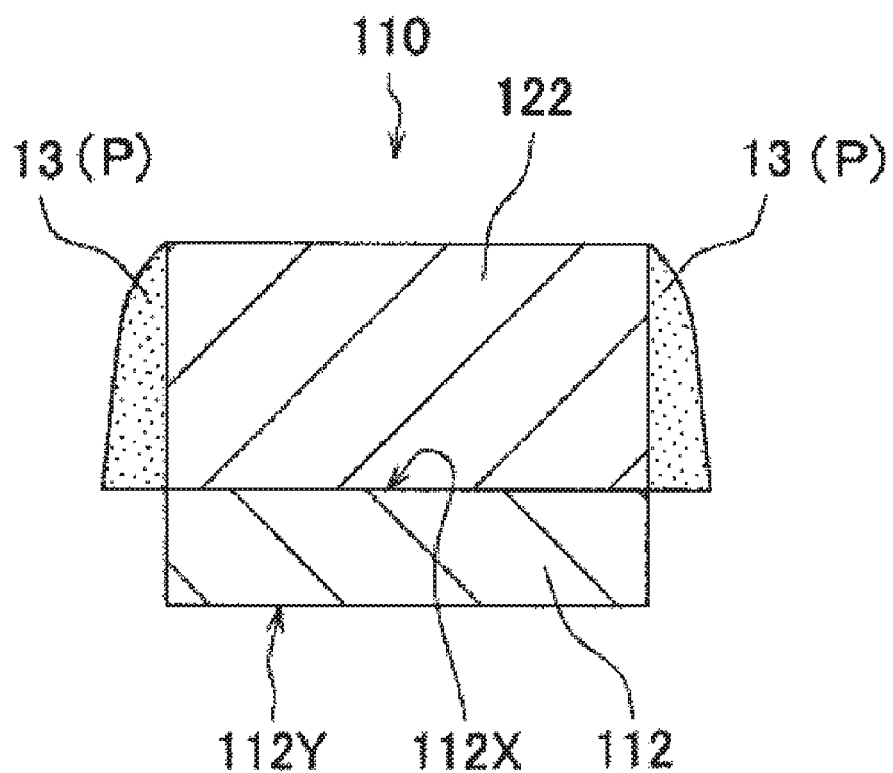
FIG. 2 is a cross-sectional view illustrating an element chip according to the exemplary embodiment of the present disclosure.

A cross-section of element chip 110 to be obtained in this manner is illustrated in FIGS. 2A and 2B. Element chip 110 includes a first layer (first element region 112) that is a semiconductor layer having lamination surface 112X and surface 112Y which is located at a side facing lamination surface 112X and a second layer (second element region 122) including an insulating film which is laminated on lamination surface 112X. Furthermore, element chip 110 includes protection film 13 which is formed so as to surround the outer peripheral of second element region 122. Protection film 13 forms projection portion P which is protruded from the end surface of first element region 112 in a surface direction.

In addition, in the present exemplary embodiment, substrate 10 is diced in a state where substrate 10 is suppressed by supporting member 22. Therefore, after dicing, element chip 110 to be obtained is picked up while peeling off from supporting member 22. After the plasma dicing step, even in a case where element chips 110 are held in close contact with supporting member 22, since projection portions P formed by protection film 13 collide with each other, the collision in first element region 112 or second element, region 122 is avoided. Accordingly, the damage in first element region 112 and second element region 122 is suppressed. In particular, by suppressing the damage in first element region 112, the cleavage from first element region 112 is suppressed and the flexural strength of element chip 110 is improved.

Second Exemplary Embodiment

Figure 3A:
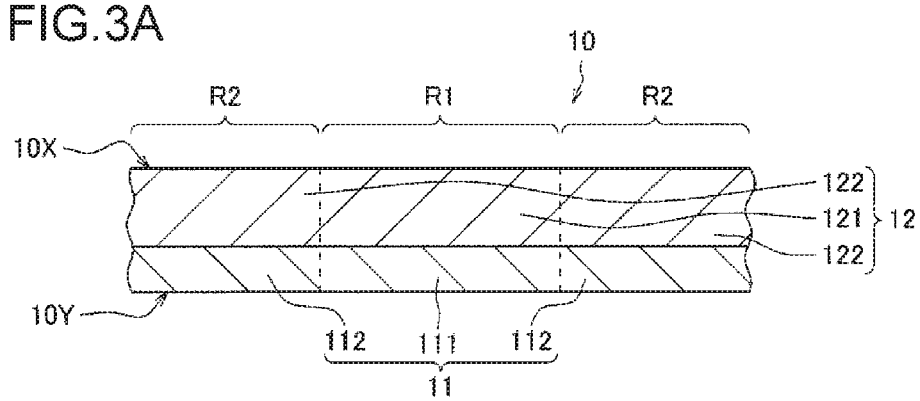
FIG. 3A is a cross-sectional view illustrating a step of a part of a manufacturing method according to a second exemplary embodiment of the present disclosure.
Figure 3B:
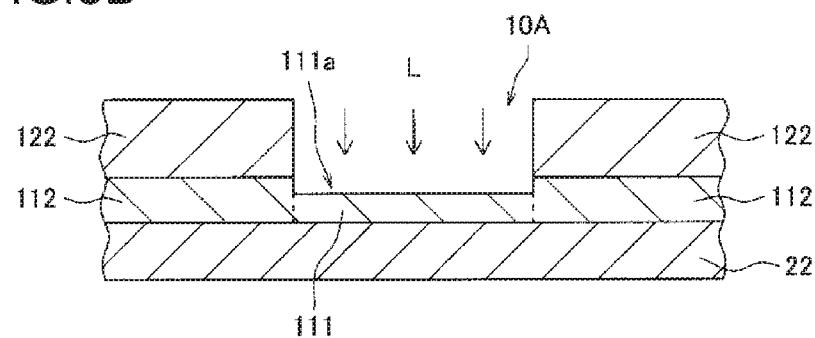
FIG. 3B is a cross-sectional view illustrating a step of a part of the manufacturing method.
Figure 3C:
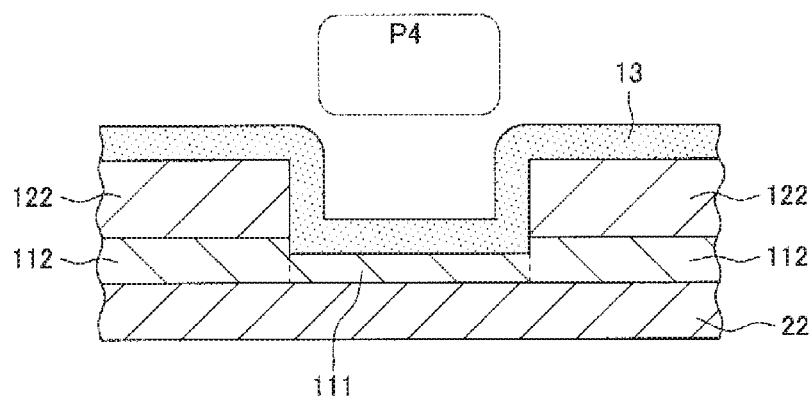
FIG. 3C is a cross-sectional view illustrating a step of a part of the manufacturing method.
Figure 3D:
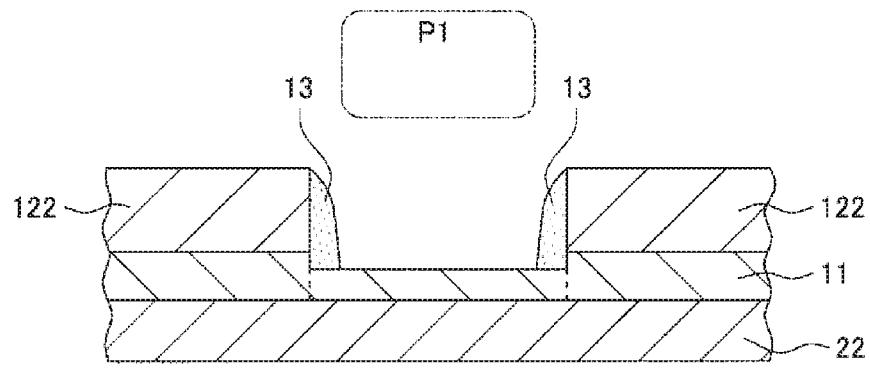
FIG. 3D is a cross-sectional view illustrating a step of a part of the manufacturing method.

The other exemplary embodiment of the present disclosure will be described with reference to FIGS. 3A to 3B. FIGS. 3A and 3B are cross-sectional views illustrating each step of a manufacturing method according to the present exemplary embodiment (FIG. 3A to 3F).

Figure 3E:
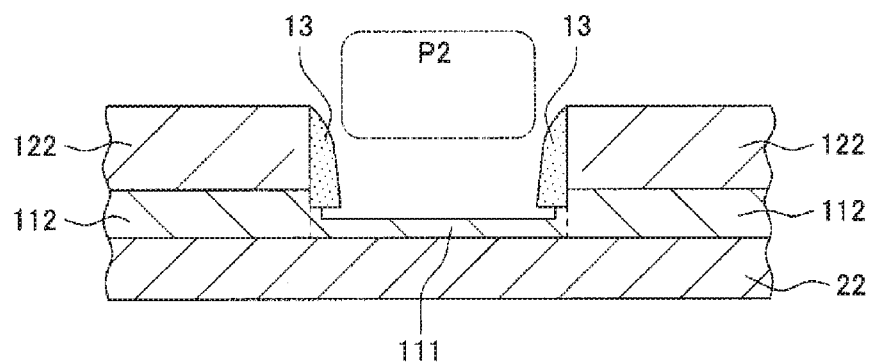
FIG. 3E is a cross-sectional view illustrating a step of a part of the manufacturing method.
Figure 3F:
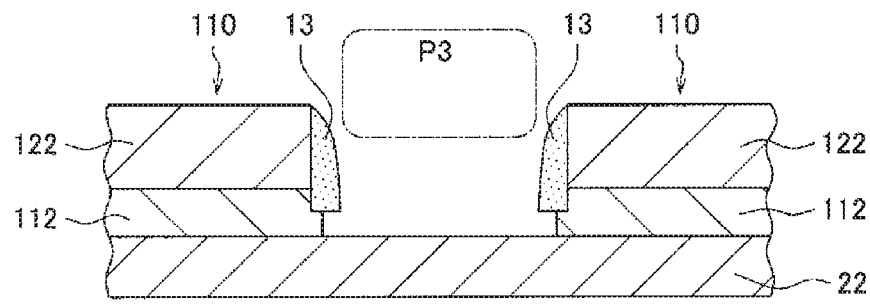
FIG. 3F is a cross-sectional view illustrating a step of a part of the manufacturing method.

The present exemplary embodiment is the same as the first exemplary embodiment except that the laser scribing is performed to a position deeper than the front surface of first dividing region 111 in the laser scribing step (FIG. 3B) and a part of the portion which is covered with protection film 13 of first dividing region 111 is etched, in the isotropic etching step (FIG. 3E). That is, an amount of the etching of protection film 13 in a thickness direction in the isotropic etching step of the present exemplary embodiment is smaller than the thickness of protection film 13.

Figure 4:
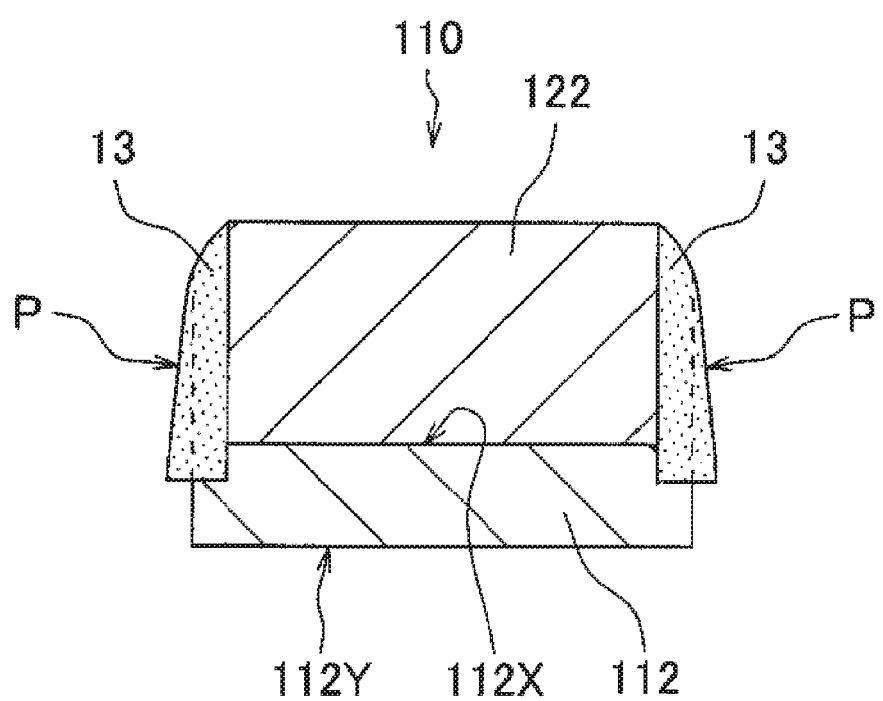
FIG. 4 is a cross-sectional view illustrating e other element chip according to the second exemplary embodiment of the present disclosure.

As illustrated in FIG. 4, element chip 110 to be obtained in this method is positioned a position where the end surface of first element region 112 is the inside the front surface of protection film 13 and outside the end surface of second element region 122. That is, a contact surface between first element region 112 and protection film 13 has an L-shape in a cross-section. Therefore, the adhesion between protection film 13 and element chip 110 is improved. In addition, projection portion P by protection film 13 is formed on the end surface of element chip 110 and the end portion of the boundary (lamination surface 112X) between first element region 112 and second element region 122 is covered with protection film 13. Accordingly, peeling off between first element region 112 and second element region 122 in lamination surface 112X is also suppressed. An amount of projection of projection portion P can be adjusted by the etching amount in the isotropic etching step (FIG. 3E).

According to the method according to the present disclosure, since the element chip with excellent deflective strength is obtained, the method is useful as a method for manufacturing the element chip from various substrates.

What is claimed is:

1. A method for manufacturing an element chip, comprising:
    a step of preparing a substrate which has a first main surface and a second main surface and includes a first layer that is a semiconductor layer, a second layer including an insulating film formed on a side of the first main surface of the first layer, a plurality of element regions, and a dividing region for defining each of the element regions;
    a laser scribing step of forming an opening including an exposing portion for exposing the first layer at the dividing region by irradiating the dividing region with laser light from the side of the first main surface;
    a protection film stacking step of stacking a protection film on each of the element regions and the dividing region, after the laser scribing step;
    a protection film etching step of removing a part of the protection film which is stacked on the dividing region and the protection film which is stacked on each of the element regions through etching the protection film anisotropically by exposing the substrate to first plasma and remaining the protection film for covering an end surface of each of the element regions, after the protection film stacking step;
    an isotropic etching step of etching the dividing region isotropically by exposing the substrate to second plasma, after the protection film etching step; and
    a plasma dicing step of dividing the substrate to a plurality of element chips including the element regions through etching the dividing region anisotropically by exposing the substrate to third plasma in a state where the second main surface is supported by a supporting member, after the isotropic etching step.

2. The method of claim 1,
wherein, in the protection film stacking step, fourth plasma is generated using a process gas containing fluorocarbon as a raw material.

3. The method of claim 1,
wherein, in the isotropic etching step, the second plasma is generated using a process gas containing a sulfur hexafluoride as a raw material.

4. An element chip comprising:
    a first layer having a lamination surface and a surface facing the lamination surface, wherein the first layer is a semiconductor layer;
    a second layer including an insulating film which is laminated on the lamination surface; and
    a protection film that surrounds an outer periphery of the second layer on an end surface of the second layer and is protruded from an end surface of the first layer, wherein the end surface of the first layer is exposed without being covered with the protection film.

5. The element chip of claim 4,
wherein the protection film contains fluorocarbon.

* * * * *